(12) United States Patent
Ahn

(10) Patent No.: US 11,269,013 B2
(45) Date of Patent: Mar. 8, 2022

(54) METHOD FOR ESTIMATING PARAMETER OF EQUIVALENT CIRCUIT MODEL FOR BATTERY, AND BATTERY MANAGEMENT SYSTEM

(71) Applicant: LG CHEM, LTD., Seoul (KR)

(72) Inventor: Hyoung Jun Ahn, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 150 days.

(21) Appl. No.: 16/616,622

(22) PCT Filed: Jan. 15, 2019

(86) PCT No.: PCT/KR2019/000607
§ 371 (c)(1),
(2) Date: Nov. 25, 2019

(87) PCT Pub. No.: WO2019/151679
PCT Pub. Date: Aug. 8, 2019

(65) Prior Publication Data
US 2020/0182939 A1 Jun. 11, 2020

(30) Foreign Application Priority Data

Feb. 1, 2018 (KR) ........................ 10-2018-0013013

(51) Int. Cl.
*G01R 31/389* (2019.01)
*G01R 31/367* (2019.01)
(Continued)

(52) U.S. Cl.
CPC ......... *G01R 31/389* (2019.01); *G01R 31/367* (2019.01); *G01R 31/3648* (2013.01); *G01R 31/382* (2019.01); *H01M 10/48* (2013.01)

(58) Field of Classification Search
CPC .................................................... G01R 31/389
(Continued)

(56) References Cited

U.S. PATENT DOCUMENTS 6,160,382 A    12/2000 Yoon et al.
10,367,235 B2*  7/2019 Guo ..................... G01R 31/382
(Continued)

FOREIGN PATENT DOCUMENTS

CN     101010596 A    8/2007
CN     102124354 A    7/2011
(Continued)

OTHER PUBLICATIONS

International Search Report issued in corresponding International Patent Application No. PCT/2019/000607, dated Apr. 26, 2019.
(Continued)

*Primary Examiner* — Ricky Go
(74) *Attorney, Agent, or Firm* — Morgan, Lewis & Bockius LLP

(57) ABSTRACT

Provided is a method and a battery management system for estimating the parameters of an equivalent circuit model. The equivalent circuit model includes a first resistor, a second resistor connected in series to the first resistor and a capacitor connected in parallel to the second resistor. The method according to an embodiment of the present disclosure individually estimates the resistance of the first resistor and the resistance of the second resistor based on a first number of terminal voltages and a first number of currents measured in a sequential order at each time step in a sliding time window having a predefined size, and stores data indicating the estimated results in the memory.

10 Claims, 6 Drawing Sheets

(51) Int. Cl.
*G01R 31/382* (2019.01)
*G01R 31/36* (2020.01)
*H01M 10/48* (2006.01)

(58) Field of Classification Search
USPC .......................................................... 702/63
See application file for complete search history.

(56) References Cited

U.S. PATENT DOCUMENTS

| | | |
|---|---|---|
| 2008/0169819 A1 | 7/2008 | Ishii |
| 2009/0027007 A1 | 1/2009 | Iwane et al. |
| 2010/0042345 A1 | 2/2010 | Kang et al. |
| 2012/0130662 A1 | 5/2012 | Dong et al. |
| 2012/0215517 A1 | 8/2012 | Bohlen et al. |
| 2013/0166235 A1 | 6/2013 | Oh et al. |
| 2014/0244225 A1 | 8/2014 | Balasingam et al. |
| 2015/0288197 A1 | 10/2015 | Choi |
| 2015/0377978 A1 | 12/2015 | Mitsuyama et al. |
| 2016/0041231 A1 | 2/2016 | Lee |
| 2018/0017628 A1 | 1/2018 | Takegami et al. |
| 2018/0059190 A1* | 3/2018 | Verbrugge ......... G01R 31/3842 |
| 2019/0094308 A1 | 3/2019 | Fukui |

FOREIGN PATENT DOCUMENTS

| | | |
|---|---|---|
| CN | 102576055 A | 7/2012 |
| CN | 104849672 A | 8/2015 |
| CN | 106405282 A | 2/2017 |
| JP | 2003-075518 A | 3/2003 |
| JP | 2007-187534 A | 7/2007 |
| JP | 2011-122951 A | 6/2011 |
| JP | 2012-063244 A | 3/2012 |
| JP | 2013-500487 A | 1/2013 |
| JP | 2014-102111 A | 6/2014 |
| JP | 2015-224919 A | 12/2015 |
| JP | 2016-003963 A | 1/2016 |
| JP | 2017-090282 A | 5/2017 |
| JP | 2017-198542 A | 11/2017 |
| KR | 2011-106952 A | 6/2011 |
| KR | 10-2013-0060623 A | 6/2013 |
| KR | 10-2015-0025932 A | 3/2015 |
| KR | 10-2016-0017416 A | 2/2016 |
| KR | 10-2017-0052936 A | 5/2017 |
| KR | 2017-116503 A | 6/2017 |
| WO | 00/31557 A | 6/2000 |
| WO | 2016/080111 A1 | 5/2016 |

OTHER PUBLICATIONS

Office Action dated Jan. 26, 2021, issued in corresponding Japanese Patent Application No. 2019-568230.
Extended European Search Report dated Aug. 11, 2020, issued in corresponding European Patent Application No. 19747604.7.
Office Action dated May 25, 2021, issued in corresponding Chinese Patent Application No. 201980002918.0. Note: 2011-122951 and JP 2017-090282 cited therein are already of record.
Office Action dated Oct. 25, 2021, issued in corresponding Korean Patent Application No. 10-2018-0013013.

* cited by examiner

METHOD FOR ESTIMATING PARAMETER OF EQUIVALENT CIRCUIT MODEL FOR BATTERY, AND BATTERY MANAGEMENT SYSTEM

TECHNICAL FIELD

The present disclosure relates to a method and a battery management system for estimating the parameters of an equivalent circuit model for a battery.

The present application claims priority to Korean Patent Application No. 10-2018-0013013 filed in the Republic of Korea on Feb. 1, 2018, the disclosure of which is incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of free charging and discharging, a very low self-discharge rate and high energy density.

To prevent the overcharge and overdischarge of a battery, it is necessary to adjust the charge current and the discharge current of the battery according to the state of charge (SOC) of the battery. However, the SOC of the battery cannot be directly measured, and is estimated based on the terminal voltage and the current of the battery. Accordingly, to control the battery more safely and efficiently, most of all, it is important to accurately estimate the SOC of the battery.

One of battery SOC estimation techniques is ampere counting (also called a current integration method). The ampere counting estimates the SOC of the battery from the results of time-sequentially accumulating the current of the battery periodically measured by a current sensor. However, due to the precision of the current sensor itself or external noise, there is a difference between the current of the battery measured by the current sensor and the battery actual current, and a difference between the SOC estimated by ampere counting and the actual SOC also increases over times.

Another conventional art for solving the above-described problem uses the extended kalman filter (EKF) to estimate the SOC of the battery. The EKF uses ampere counting together with an equivalent circuit model for predicting a change in voltage with the current of the battery, and thus can estimate the SOC of the battery more accurately than an approach simply using ampere counting alone.

During the operation of the EKF, it is necessary to periodically update the parameters of the equivalent circuit model based on the battery terminal voltage, the battery current and/or the battery temperature using a given parameter map. The data included in the parameter map according to the conventional art indicates fixed values determined from the charge/discharge test results of experimental batteries. Accordingly, the parameters of the equivalent circuit model updated using the parameter map according to the conventional art fail to fully reflect changes in electrochemical properties (for example, an increase in internal resistance) of the battery due to deviations in the manufacturing process of the battery or repeated charging/discharging.

DISCLOSURE

Technical Problem

The present disclosure is designed to solve the above-described problem, and therefore the present disclosure is directed to providing a method and a battery management system for periodically updating the parameters of an equivalent circuit model that models the dynamic characteristics of the terminal voltage of a battery based on the terminal voltage and the current of the battery measured in periodic manner.

These and other objects and advantages of the present disclosure can be understood by the following description and will be apparent from the embodiments of the present disclosure. Further, it will be readily understood that the objects and advantages of the present disclosure can be realized by the means set forth in the appended claims and combinations thereof.

Technical Solution

Various embodiments of the present disclosure for achieving the above-described object are as follows.

A method according to an embodiment of the present disclosure is for estimating parameters of an equivalent circuit model for a battery. The equivalent circuit model includes a first resistor, a second resistor connected in series to the first resistor and a capacitor connected in parallel to the second resistor. The method includes reading, from a memory, measurement data indicating a first number of terminal voltages and a first number of currents measured in a sequential order at each time step in a sliding time window having a predefined size, calculating a voltage variation of a current time step based on a terminal voltage measured at the current time step and a terminal voltage measured at a previous time step included in the first number of terminal voltages, calculating a current variation of the current time step based on a current measured at the current time step and a current measured at the previous time step included in the first number of currents, and estimating a resistance of the first resistor at the current time step based on a resistance of the first resistor estimated at the previous time step, the voltage variation and the current variation.

The method may further include determining whether the voltage variation and the current variation satisfy a first data filtering condition. The step of estimating the resistance of the first resistor at the current time step may be performed when the first data filtering condition is satisfied.

The step of estimating the resistance of the first resistor at the current time step may use a recursive least square algorithm. The recursive least square algorithm includes the following Equations 1 and 2, $$P_1(n) = \frac{1}{\lambda}\left\{P_1(n-1) - \frac{P_1(n-1)^2 \Delta I(n)^2}{\lambda + P_1(n-1)\Delta I(n)^2}\right\} \quad \text{<Equation 1>}$$

$$R_{1\_est}(n) = \quad \text{<Equation 2>}$$
$$R_{1\_est}(n-1) + P_1(n)\Delta I(n)\{\Delta V(n) - R_{1\_est}(n-1)\Delta I(n)\}$$

wherein $P_1(n)$ is a correction factor for the current time step, $P_1(n-1)$ is a correction factor for the previous time step, ΔI(n) is the current variation, ΔV(n) is the voltage variation, λ is a predefined forgetting factor, $R_{1\_est}(n)$ is the resistance of the first resistor estimated at the current time step, and $R_{1\_est}(n-1)$ is the resistance of the first resistor estimated at the previous time step.

The method may further include setting the resistance of the first resistor estimated at the previous time step as the estimated resistance of the first resistor at the current time step, when the first data filtering condition is not satisfied.

The first data filtering condition may be satisfied when an absolute value of the current variation is larger than a first threshold, and multiplication of the voltage variation and the current variation is a positive value.

The method may further include determining whether the first number of currents satisfy a second data filtering condition, calculating a measured voltage vector based on the first number of terminal voltages and a measured current vector based on the first number of currents, when the second data filtering condition is satisfied, and estimating a resistance of the second resistor at the current time step based on the measured voltage vector, the measured current vector, the resistance of the first resistor estimated at the current time step and the resistance of the second resistor estimated at the previous time step.

The step of estimating the resistance of the second resistor at the current time step may use a function based on a recursive least square algorithm.

The second data filtering condition may be satisfied when a difference between maximum and minimum of the first number of currents is larger than a second threshold.

A battery management system according to another embodiment of the present disclosure is for estimating parameters of an equivalent circuit model for a battery. The equivalent circuit model includes a first resistor, a second resistor connected in series to the first resistor and a capacitor connected in parallel to the second resistor. The battery management system includes a sensing unit configured to measure a terminal voltage and a current of the battery at each time step, and a control unit operably coupled to the sensing unit, and configured to record the terminal voltage and the current measured by the sensing unit at each time step in a memory. The control unit is configured to read, from the memory, measurement data indicating a first number of terminal voltages and a first number of currents measured in a sequential order at each time step in a sliding time window having a predefined size. The control unit is configured to calculate a voltage variation of a current time step based on a terminal voltage measured at the current time step and a terminal voltage measured at a previous time step included in the first number of terminal voltages. The control unit is configured to calculate a current variation of a current time step based on a current measured at the current time step and a current measured at the previous time step included in the first number of currents. The control unit is configured to estimate a resistance of the first resistor at the current time step based on a resistance of the first resistor estimated at the previous time step, the voltage variation and the current variation.

The control unit may be configured to calculate a measured voltage vector based on the first number of terminal voltages and a measured current vector based on the first number of currents, when the first number of currents satisfy a second data filtering condition. The control unit may be configured to estimate a resistance of the second resistor at the current time step based on the measured voltage vector, the measured current vector and the resistance of the first resistor estimated at the current time step.

The control unit may be configured to estimate the resistance of the second resistor at the current time step using a function based on a recursive least square algorithm.

Advantageous Effects

According to at least one of the embodiments of the present disclosure, it is possible to periodically update the parameters of an equivalent circuit model that models the dynamic characteristics of the terminal voltage of a battery based on the terminal voltage and the current of the battery measured in periodic manner.

The periodically updated parameters of the equivalent circuit model reflect the dynamic characteristics of the battery changing as the battery degrades. Thus, according to the present disclosure, the parameters of the equivalent circuit model are adaptively adjusted as the battery degrades, making it possible to predict the terminal voltage of the battery more accurately. Additionally, the predicted terminal voltage can be used to control a component (for example, a switch) electrically coupled to the battery, making it possible to prevent the overvoltage, undervoltage, overcharge and/or overdischarge of the battery.

The effects of the present disclosure are not limited to the effects mentioned above, and these and other effects will be clearly understood by those skilled in the art from the appended claims.

BRIEF DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

MODE FOR DISCLOSURE

Figure 1:
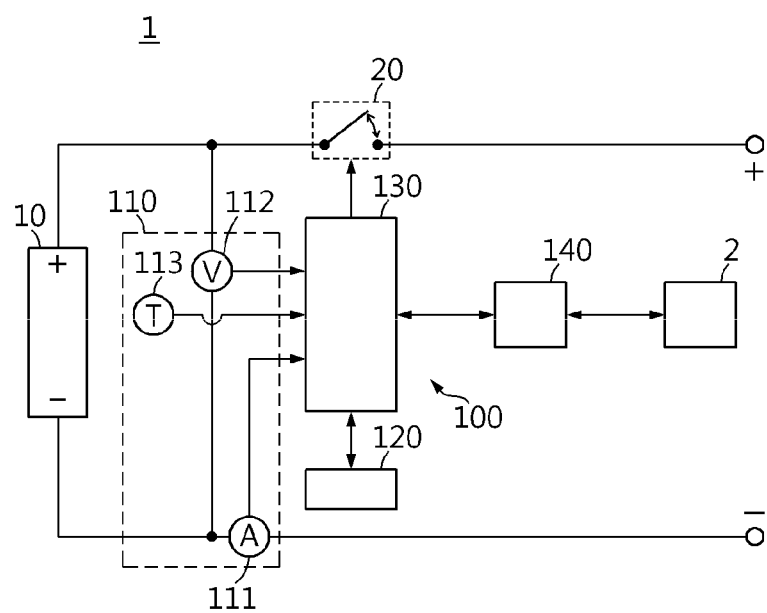
FIG. 1 is a diagram showing the functional configuration of a battery pack according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

FIG. 1 is a diagram showing the functional configuration of a battery pack 1 according to an embodiment of the present disclosure.

Referring to FIG. 1, the battery pack 1 includes a battery 10, a switch 20 and a battery management system 100. The switch 20 is configured to adjust the magnitude of charge current and/or discharge current of the battery 10 in response to a switching signal (for example, a pulse width modulation signal) from the battery management system 100.

The battery management system 100 is electrically coupled to the battery 10 and configured to monitor and control the state of the battery 10. The battery management system 100 includes a sensing unit 110, a memory 120, a control unit 130 and a communication interface 140.

The sensing unit 110 includes a current measuring unit 111. The current measuring unit 111 measures the current of the battery 10 at each time step defined by a predefined length of time, and transmits a current signal indicating the measured current to the control unit 130. The current at the time of discharging the battery 10 may be referred to as 'discharge current', and the current at the time of charging the battery 10 may be referred to as 'charge current'. The control unit 130 may convert the current signal in analog form transmitted from the current measuring unit 111 to current data in digital form. Hereinafter, assume that the current at the time of charging is measured as a positive value, and the current at the time of discharging is measured as a negative value.

The sensing unit 110 may further include a voltage measuring unit 112. The voltage measuring unit 112 measures the terminal voltage of the battery 10 at each time step, and transmits a voltage signal indicating the measured terminal voltage to the control unit 130. The control unit 130 may convert the voltage signal in analog form transmitted from the voltage measuring unit 112 to voltage data in digital form.

The sensing unit 110 may further include a temperature measuring unit 113. The temperature measuring unit 113 measures the temperature of the battery 10 at each time step, and transmits a temperature signal indicating the measured temperature to the control unit 130. The control unit 130 may convert the temperature signal in analog form transmitted from the temperature measuring unit 113 to temperature data in digital form. The current measuring unit 111, the voltage measuring unit 112 and the temperature measuring unit 113 may operate in time synchronization with each other. Hereinafter, $k^{th}$ time step is expressed as 'time step k'. Additionally, the terminal voltage and the current measured by the sensing unit 110 at the time step k are respectively expressed as $V(k)$ and $I(k)$.

The memory 120 may additionally store data, instructions and software required for the overall operation of the battery management system 100. The memory 120 may store data indicating the result of the operation performed by the control unit 130. The terminal voltage, the current and/or the temperature of the battery 10 measured by the sensing unit 110 at each time step may be recorded in the memory 120 in a sequential order. The memory 120 may include at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

The control unit 130 is operably coupled to the sensing unit 110, the memory 120 and the communication interface 140. The control unit 130 records the terminal voltage, the current and/or the temperature of the battery 10 measured by the sensing unit 110 at each time step in the memory 120 in a sequential order. The control unit 130 may move, at each time step, a sliding time window having a predefined size as much as a time interval Δt of the time step, and read a plurality of terminal voltages and a plurality of currents measured in the sliding time window among all terminal voltages and currents recorded in the memory 120 from the memory 120. For example, when the time interval of the time step is 0.01 sec, and the size of the sliding time window is 10 sec, 1000 terminal voltages and 1000 currents may be read from the memory 120 at each time step.

The control unit 130 may be physically implemented using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The communication interface 140 may be coupled to an external device 2 such as an electronic control unit (ECU) of an electric vehicle to enable communication between. The communication interface 140 may receive a command message from the external device 2, and provide the received command message to the control unit 130. The command message may be a message that requests the activation of a specific function of the apparatus. The communication interface 140 may transmit a notification message from the control unit 130 to the external device 2. The notification message may be a message for informing the external device 2 of the result of the function (for example, the state of charge of the battery) performed by the control unit 130.

Figure 2:
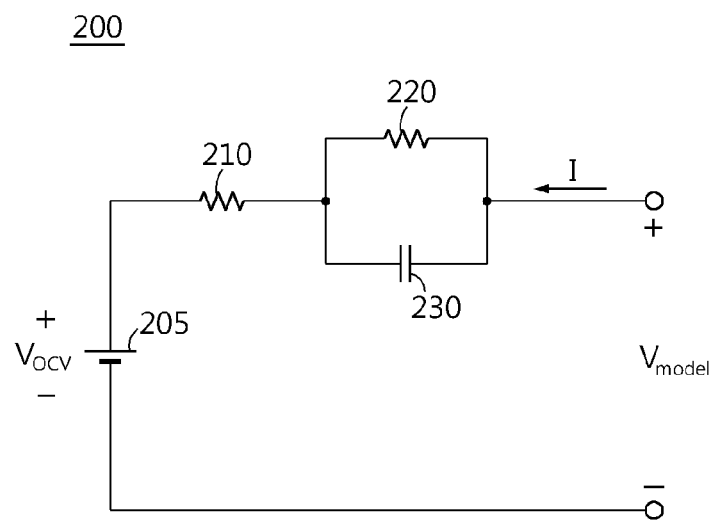
FIG. 2 is a diagram showing an exemplary equivalent circuit model for a battery.

FIG. 2 is a diagram showing an exemplary equivalent circuit model 200 for the battery.

Referring to FIG. 2, the equivalent circuit model 200 may include a voltage source 205, a first resistor 210, a second resistor 220 and a capacitor 230. The parameters of the equivalent circuit model 200 may include the resistance of the first resistor 210, the resistance of the second resistor 220 and the capacitance of the capacitor 230.

The voltage source 205 represents an open circuit voltage (OCV) $V_{OCV}$ of the battery determined from the State Of Charge (SOC) and the temperature of the battery. That is, the OCV $V_{OCV}$ may be uniquely determined when the SOC and the temperature are determined. The OCV $V_{OCV}$ may be predefined for each SOC and each temperature. That is, an OCV-SOC map defining a correlation between the SOC, the temperature and the OCV of the battery may be pre-stored in the memory 110. The OCV at $k^{th}$ time step may be expressed as $V_{OCV}(k)$.

The first resistor 210 models short-term voltage fluctuations by the current flowing through the battery. The terminal voltage measured at the time of charging the battery is higher than the OCV due to the internal resistance of the battery 10. On the contrary, the terminal voltage measured at the time of discharging the battery is lower than the OCV.

The second resistor 220 and the capacitor 230 are connected to each other in parallel. As shown, the second resistor 220 may be connected in series to the first resistor 210. A parallel connection circuit of the second resistor 220 and the capacitor 230 may be referred to as an 'RC pair'. As opposed to the first resistor 210, the second resistor 220 is connected in parallel to the capacitor 230. Accordingly, the RC pair may model the polarization voltage generated during charging and discharging of the battery. That is, the parallel combination of the second resistor 220 and the capacitor 230 is for modeling the transient response history of the battery.

Assume that the resistance of the first resistor 210 and the resistance of the second resistor 220 are constant as $R_1$ and $R_2$, respectively. If $\Delta t$ is very small, each of the terminal voltage and the current of the battery 10 measured at an arbitrary time step may be constant until the next time step, therefore the OCV of the voltage source 205 may be also handled as being constant between two adjacent time steps.

Assume that the polarization voltage by the RC pair at an arbitrary time point at which the time step k starts is $V_{pola}$, and the resistance of the first resistor 210 and the resistance of the second resistor 220 are constant as $R_1$ and $R_2$, respectively, from the time step k to the time step q. Then, voltage $V_{model}(q)$ of the equivalent circuit model 200 at the time step q may be expressed as the following Equation 1.

$$V_{model}(q) = V_{ocv}(q) + R_1 I(q) + V_{pola} \exp^{-\frac{(q-k)\Delta t}{\tau}} + \sum_{i=1}^{q-k} R_2 I(i+k) \left\{ \exp^{-\frac{((q-k)-i)\Delta t}{\tau}} - \exp^{-\frac{((q-k)-i+1)\Delta t}{\tau}} \right\}$$ <Equation 1>

τ is a preset time constant of the RC pair.

Figure 3:
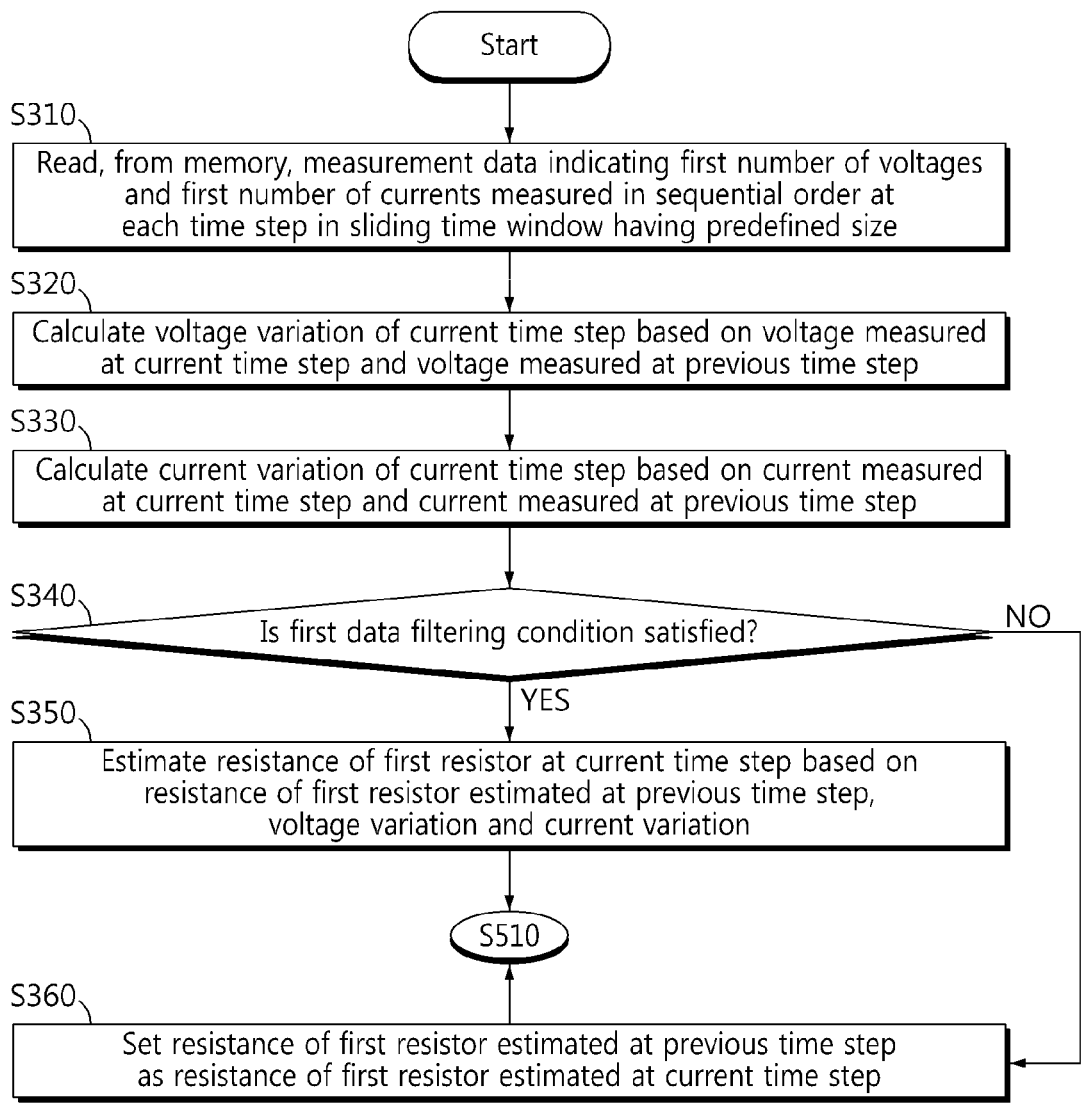
FIG. 3 is a flowchart showing a method for estimating the resistance of a first resistor as one of parameters of an equivalent circuit model according to an embodiment of the present disclosure.
Figure 4:
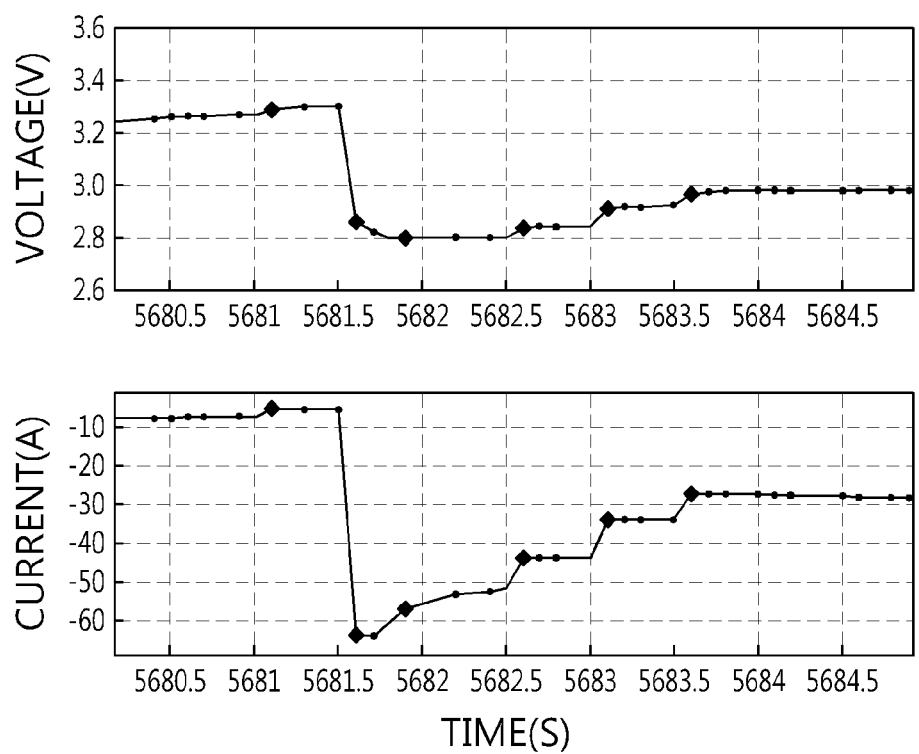
FIG. 4 shows graphs for reference in describing the method of FIG. 3.

FIG. 3 is a flowchart showing a method for estimating the resistance of the first resistor 210 as one of parameters of the equivalent circuit model 200 according to an embodiment of the present disclosure, and FIG. 4 shows graphs for reference in describing the method of FIG. 3.

In step S310, the control unit 130 reads, from the memory 120, measurement data indicating a first number of terminal voltages and a first number of currents measured by the sensing unit 110 in a sequential order at each time step in a sliding time window having a predefined size. That is, the control unit 130 reads, from the memory 120, the first number of terminal voltages and the first number of currents recorded in the memory 120 over a predefined time in the past from the current time step using the sliding time window of which the end time point has moved to the current time step. The predefined time is equal to the size of the sliding time window. The first number is set by the predefined time and the time interval $\Delta t$ between each time step. For example, when the predefined time=10 sec and $\Delta t$=0.01 sec, the first number=10 sec/0.01 sec=1000. Each time the sliding time window moves by $\Delta t$, an oldest one of the first number of terminal voltages is discarded, and a newly measured terminal voltage is added. Likewise, each time the sliding time window moves by $\Delta t$, an oldest one of the first number of currents is discarded, and a newly measured current is added.

The first number of terminal voltages include terminal voltage V(n) measured at the current time step and terminal voltage V(n−1) measured at the previous time step. The first number of currents include current I(n) measured at the current time step and current I(n−1) measured at the previous time step.

In step S320, the control unit 130 calculates a voltage variation $\Delta V(n)$ of the current time step based on the terminal voltage V(n) measured at the current time step and the terminal voltage V(n−1) measured at the previous time step. In this instance, the control unit 130 may calculate the voltage variation $\Delta V(n)$ by subtracting the terminal voltage V(n−1) measured at the previous time step from the terminal voltage V(n) measured at the current time step. That is, $\Delta V(n)=V(n)-V(n-1)$.

In step S330, the control unit 130 calculates a current variation $\Delta I(n)$ of the current time step based on the current I(n) measured at the current time step and the current I(n−1) measured at the previous time step. In this instance, the control unit 130 may calculate the current variation $\Delta I(n)$ by subtracting I(n−1) measured at the previous time step from I(n) measured at the current time step. That is, $\Delta I(n)=I(n)-I(n-1)$.

Dissimilar to that of FIG. 3, the step S330 may be performed earlier than the step S320, or at the same time as the step S320.

In step S340, the control unit 130 determines whether the voltage variation $\Delta V(n)$ and the current variation $\Delta I(n)$ satisfy a first data filtering condition. The first data filtering condition is a criterion for determination as to whether $\Delta V(n)$ and $\Delta I(n)$ are suitable as learning data for estimating the resistance of the first resistor 210.

When (i) the absolute value of the current variation $\Delta I(n)$ is larger than a first threshold, and (ii) the multiplication of the voltage variation $\Delta V(n)$ and the current variation $\Delta I(n)$ is larger than 0, the control unit 130 may determine that the first data filtering condition is satisfied.

The first threshold is a real number greater than 0, and is preset on the basis of a measurement error of the current measuring unit 111. The first resistor 210 is for modeling instantaneous voltage fluctuations formed due to the internal resistance of the battery 10, therefore when the absolute value of $\Delta I(n)$ is larger than the first threshold, it is suitable to use $\Delta I(n)$ to estimate the resistance of the first resistor 210 at the current time step. In contrast, when the absolute value of $\Delta I(n)$ is equal to or less than the first threshold, it is highly likely that $\Delta I(n)$ results from the measurement error of the current measuring unit 111, and thus it is unsuitable to use $\Delta I(n)$ to estimate the resistance of the first resistor 210 at the current time step.

Additionally, according to the Ohm's law, the voltage of the first resistor 210 is proportional to the current flowing through the first resistor 210. Accordingly, only when $\Delta V(n)$ and $\Delta I(n)$ have the same sign, it is suitable to use $\Delta V(n)$ and $\Delta I(n)$ to estimate the resistance of the first resistor 210 at the current time step. In contrast, ΔV(n) having a positive value and ΔI(n) having a negative value or V(n) having a negative value and ΔI(n) having a positive value signify that a voltage change of the first resistor 210 is against the Ohm's law, and thus it is unsuitable to use ΔI(n) to estimate the resistance of the first resistor 210 at the current time step. Each of the two graphs shown in FIG. 4 shows a change in terminal voltage and current of the battery 10 in the same time range. In FIG. 4, the terminal voltage and the current satisfying the first data filtering condition are each marked as a bold dot.

When the value of the step S340 is "YES", the method moves to step S350. On the contrary, when the value of the step S340 is "NO", the method moves to step S360.

In step S350, the control unit 130 estimates the resistance of the first resistor 210 at the current time step based on the resistance $R_{1\_est}(n-1)$ of the first resistor 210 estimated at the previous time step, the voltage variation ΔV(n) and the current variation ΔI(n).

The control unit 130 may estimate the resistance of the first resistor 210 at the current time step using the recursive least square (RLS) algorithm, and a detailed description will be provided below.

First, the weighted sum of squared errors 51 related to resistance estimation of the first resistor 210 may be expressed as the following Equation 2.

$$S1 = \sum_{k=1}^{n} \lambda^{n-k} \{\Delta V(k) - R_{1\_est}(n)\Delta I(k)\}^2 \qquad \text{<Equation 2>}$$

In Equation 2, $R_{1\_est}(n)$ is the resistance of the first resistor 210 to be estimated. Additionally, in Equation 2, λ is a first forgetting factor which is preset as being greater than 0 and smaller than 1. λ will give a smaller influence on the resistance estimation of the first resistor 210 as the terminal voltage and the current are measured at an earlier time in the past from the current time step.

The solution of the weighted sum of squared errors S1, i.e., $R_{1\_est}(n)$ to minimize S1, may be calculated by the following Equations 3 and 4.

$$P_1(n) = \frac{1}{\lambda}\left\{P_1(n-1) - \frac{P_1(n-1)^2 \Delta I(n)^2}{\lambda + P_1(n-1)\Delta I(n)^2}\right\} \qquad \text{<Equation 3>}$$

$$R_{1\_est}(n) = \qquad \text{<Equation 4>}$$
$$R_{1\_est}(n-1) + P_1(n)\Delta I(n)\{\Delta V(n) - R_{1\_est}(n-1)\Delta I(n)\}$$

$P_1(n)$ and $P_1(n-1)$ are a correction factor of the current time step and a correction factor of the previous time step, respectively. That is, $P_1(n-1)$ is updated to $P_1(n)$ by Equation 4.

In Equation 4, $R_{1\_est}(n-1)$ is the pre-estimated resistance of the first resistor 210 at the previous time step. The control unit 130 may calculate the estimated resistance $R_{1\_est}(n)$ of the first resistor 210 at the current time step using Equation 3 and Equation 4.

For the case in which a value of the symbol n indicating the current time step becomes 1 due to the initialization of the battery management system 100, $P_1(0)$ and $R_{1\_est}(0)$ may be pre-stored in the memory 120 as different initial values. For example, $P_1(0)=(1-\lambda)/(T_{H1})^2$, and $TH_1$ may be equal to the first threshold. Additionally, $R_{1\_est}(0)$ may be a preset value corresponding to the temperature of the battery 10 measured at the initial time step. The control unit 130 stores the estimated resistance $R_{1\_est}(n)$ of the first resistor 210 at the current time step in the memory 120.

In step S360, the control unit 130 sets the resistance $R_{1\_est}(n-1)$ of the first resistor 210 estimated at the previous time step as the resistance $R_{1\_est}(n)$ of the first resistor 210 estimated at the current time step. That is, the resistance of the first resistor 210 at the current time step is handled as being equal to the resistance $R_{1\_est}(n-1)$ of the first resistor 210 estimated at the previous time step. Accordingly, dissimilar to S350, $R_{1\_est}(n)=R_{1\_est}(n-1)$.

Figure 5:
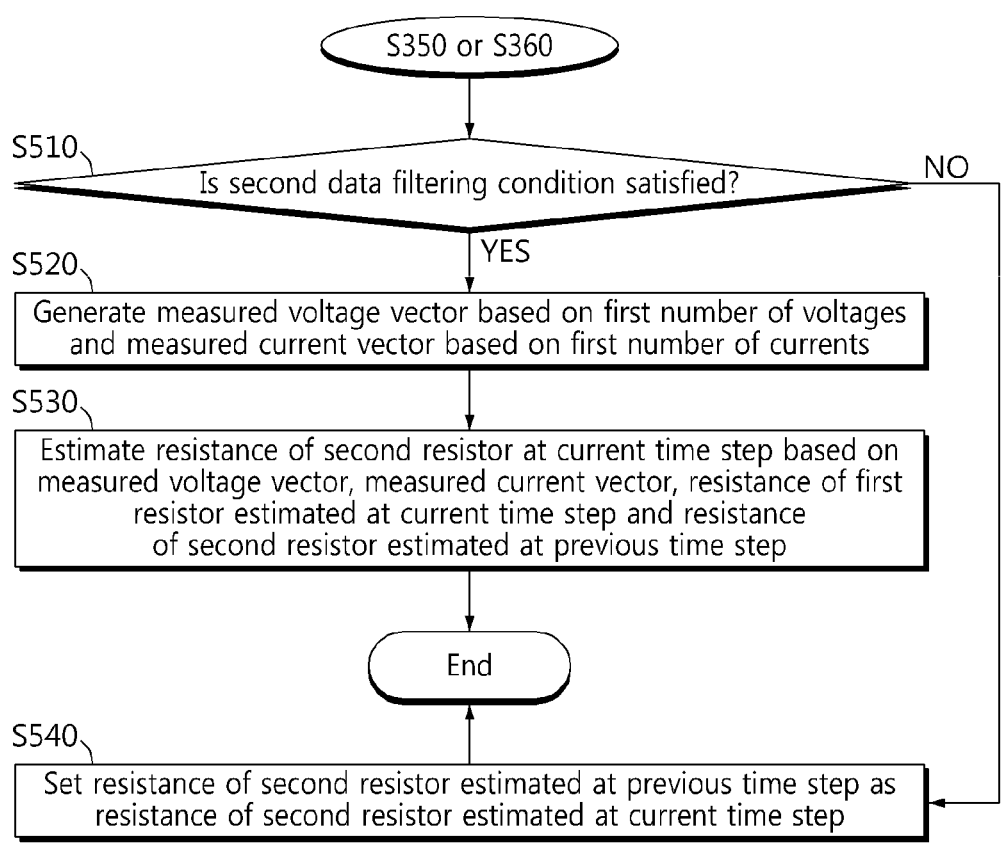
FIG. 5 is a flowchart showing a method for estimating the resistance of a second resistor as one of parameters of an equivalent circuit model according to an embodiment of the present disclosure.
Figure 6:
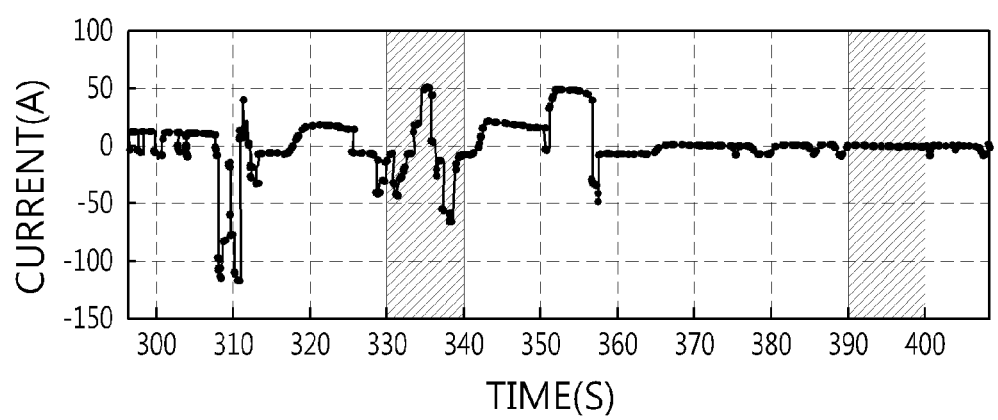
FIG. 6 shows a graph for reference in describing the method of FIG. 5.

FIG. 5 is a flowchart showing a method for estimating the resistance of the second resistor 220 as another one of parameters of the equivalent circuit model 200 according to an embodiment of the present disclosure, and FIG. 6 shows a graph for reference in describing the method of FIG. 5.

In step S510, the control unit 130 determines whether the first number of currents satisfy a second data filtering condition. The second data filtering condition is a criterion for determination as to whether the first number of terminal voltages and the first number of currents are suitable as learning data for estimating the resistance of the second resistor 220.

When a difference between the maximum and the minimum of the first number of currents is larger than a second threshold, the control unit 130 may determine that the second data filtering condition is satisfied. The graph shown in FIG. 6 shows a change in the current of the battery 10 measured for a longer time than the size of the sliding time window. Assume that the size of the sliding time window is 10 sec, and the second threshold is 10 A. Seeing FIG. 6, a difference between the maximum and the minimum of the current measured from 330 sec to 340 sec is 100 A or above. Accordingly, the current measured from 330 sec to 340 sec satisfies the second data filtering condition. In contrast, the current measured from 390 sec to 400 sec is constant, and does not satisfy the second data filtering condition.

Due to the capacitor 230, the voltage of the second resistor 220 changes more slowly than the voltage of the first resistor 210. Accordingly, it is preferred that the second threshold is larger than the first threshold.

When the value of the step S510 is "YES", step S520 is performed. When the value of the step S510 is "NO", step S540 is performed.

In step S520, the control unit 130 generates a measured voltage vector based on the first number of terminal voltages and a measured current vector based on the first number of currents. Hereinafter, assume that the first number is m of 2 or greater. Those skilled in the art will understand that n indicating the order of the current time step is larger than m.

The measured voltage vector may be expressed as m×1 matrix as below.

$$V_{vec}=[V(n-m+1)V(n-m+2)V(n-m+3)\ldots V(n)]^T$$

The measured current vector may be expressed as m×1 matrix as below.

$$I_{vec}=[I(n-m+1)I(n-m+2)I(n-m+3)\ldots I(n)]^T$$

In the above, the symbol T indicates the transposed matrix.

In step S530, the control unit 130 estimates the resistance of the second resistor 220 at the current time step based on the measured voltage vector $V_{vec}$, the measured current vector $I_{vec}$, the resistance $R_{1\_est}(n)$ of the first resistor 210 estimated at the current time step, and the resistance $R_{2\_est}(n-1)$ of the second resistor 220 estimated at the previous time step.

The control unit 130 may estimate the resistance of the second resistor 220 at the current time step using the following Equation 5 representing a function based on the RLS algorithm.

$$R_{2\_est}(n)=f(R_{1\_est}(n),R_{2\_est}(n-1),V_{vec},I_{vec}) \quad \text{<Equation 5>}$$

In Equation 5, the function $f(\ )$ outputs $R_{2\_est}(n)$ when $R_{1\_est}(n)$, $R_{1\_est}(n-1)$, $V_{vec}$ and $I_{vec}$ are inputted. $R_{2\_est}(n-1)$ is the estimated resistance of the second resistor 220 indicating the transient response history of the battery in the previous observation period. The previous observation period is a period from the initial time step to the previous time step. Likewise, $R_{2\_est}(n)$ is the estimated resistance of the second resistor 220 indicating the transient response history of the battery in the current observation period.

In step S540, the control unit 130 sets the resistance $R_{2\_est}(n-1)$ of the second resistor 220 estimated at the previous time step as the resistance $R_{2\_est}(n)$ of the second resistor 220 estimated at the current time step. That is, the resistance of the second resistor 220 at the current time step is handled as being equal to the resistance $R_{2\_est}(n-1)$ of the second resistor 220 estimated at the previous time step. Accordingly, dissimilar to S530, $R_{2\_est}(n)=R_{1\_est}(n-1)$.

The control unit 130 may predict the terminal voltage of the battery 10 using the estimated resistance $R_{1\_est}(n)$ of the first resistor 210 and the estimated resistance $R_{2\_est}(n)$ of the second resistor 220, and adjust the duty cycle of the switching signal outputted to the switch 20 based on the predicted terminal voltage.

The control unit 130 may estimate the SOC of the battery 10 at the current time step using the estimated resistance $R_{1\_est}(n)$ of the first resistor 210 and the estimated resistance $R_{2\_est}(n)$ of the second resistor 220, and adjust the duty cycle of the switching signal outputted to the switch 20 based on the estimated SOC.

Data indicating the results of performing each step shown in FIGS. 3 and 5 may be stored in the memory 120 by the control unit 130 whenever each step is finished.

The embodiments of the present disclosure described hereinabove are not implemented only through the apparatus and method, and may be implemented through programs that perform functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A method for estimating parameters of an equivalent circuit model for a battery, the equivalent circuit model including a first resistor, a second resistor connected in series to the first resistor, and a capacitor connected in parallel to the second resistor, the method comprising:
   reading, from a memory, measurement data indicating a first number of terminal voltages and a first number of currents measured in a sequential order at each time step in a sliding time window having a predefined size;
   calculating a voltage variation of a current time step based on a terminal voltage measured at the current time step and a terminal voltage measured at a previous time step included in the first number of terminal voltages;
   calculating a current variation of the current time step based on a current measured at the current time step and a current measured at the previous time step included in the first number of currents;
   estimating a resistance of the first resistor at the current time step based on a resistance of the first resistor estimated at the previous time step, the voltage variation, and the current variation;
   determining whether the first number of currents satisfy a second data filtering condition;
   calculating a measured voltage vector based on the first number of terminal voltages and a measured current vector based on the first number of currents, when the second data filtering condition is satisfied; and
   estimating a resistance of the second resistor at the current time step based on the measured voltage vector, the measured current vector, the resistance of the first resistor estimated at the current time step, and the resistance of the second resistor estimated at the previous time step.

2. The method according to claim 1, further comprising:
   determining whether the voltage variation and the current variation satisfy a first data filtering condition,
   wherein estimating the resistance of the first resistor at the current time step is performed when the first data filtering condition is satisfied.

3. The method according to claim 2, further comprising setting the resistance of the first resistor estimated at the previous time step as the resistance of the first resistor estimated at the current time step, when the first data filtering condition is not satisfied.

4. The method according to claim 2, wherein the first data filtering condition is satisfied when:
   an absolute value of the current variation is larger than a first threshold; and
   a multiplication value of the voltage variation and the current variation is a positive value.

5. The method according to claim 1, wherein estimating the resistance of the first resistor at the current time step uses a recursive least square algorithm.

6. The method according to claim 5, wherein the recursive least square algorithm includes the following Equations 1 and 2:

$$P_1(n) = \frac{1}{\lambda}\left\{P_1(n-1) - \frac{P_1(n-1)^2 \Delta I(n)^2}{\lambda + P_1(n-1)\Delta I(n)^2}\right\} \quad \text{<Equation 1>}$$

$$R_{1\_est}(n) = \quad \text{<Equation 2>}$$
$$R_{1\_est}(n-1) + P_1(n)\Delta I(n)\{\Delta V(n) - R_{1\_est}(n-1)\Delta I(n)\},$$

where:
   $P_1(n)$ is a correction factor for the current time step,
   $P_1(n-1)$ is a correction factor for the previous time step,
   $\Delta I(n)$ is the current variation,
   $\Delta V(n)$ is the voltage variation, λ is a predefined forgetting factor,
$R_{1\_est}(n)$ is the resistance of the first resistor estimated at the current time step, and
$R_{1\_est}(n-1)$ is the resistance of the first resistor estimated at the previous time step.

7. The method according to claim 1, wherein estimating the resistance of the second resistor at the current time step uses a function based on a recursive least square algorithm.

8. The method according to claim 1, wherein the second data filtering condition is satisfied when a difference between maximum and minimum of the first number of currents is larger than a second threshold.

9. A battery management system for estimating parameters of an equivalent circuit model for a battery, the equivalent circuit model including a first resistor, a second resistor connected in series to the first resistor, and a capacitor connected in parallel to the second resistor, the battery management system comprising:
   a sensing unit configured to measure a terminal voltage and a current of the battery at each time step; and
   a control unit operably coupled to the sensing unit, the control unit being configured to:
      record the terminal voltage and the current measured by the sensing unit at each time step in a memory;
      read, from the memory, measurement data indicating a first number of terminal voltages and a first number of currents measured in a sequential order at each time step in a sliding time window having a predefined size;
      calculate a voltage variation of a current time step based on a terminal voltage measured at the current time step and a terminal voltage measured at a previous time step included in the first number of terminal voltages;
      calculate a current variation of a current time step based on a current measured at the current time step and a current measured at the previous time step included in the first number of currents;
      estimate a resistance of the first resistor at the current time step based on a resistance of the first resistor estimated at the previous time step, the voltage variation and the current variation;
      calculate a measured voltage vector based on the first number of terminal voltages and a measured current vector based on the first number of currents, when the first number of currents satisfy a second data filtering condition; and
      estimate a resistance of the second resistor at the current time step based on the measured voltage vector, the measured current vector, and the resistance of the first resistor estimated at the current time step.

10. The battery management system according to claim 9, wherein the control unit is further configured to estimate the resistance of the second resistor at the current time step using a function based on a recursive least square algorithm.

* * * * *